United States Patent
Sun

(10) Patent No.: US 7,581,583 B2
(45) Date of Patent: Sep. 1, 2009

(54) HEAT DISSIPATING DEVICE WITH ADJUSTING MEMBER

(75) Inventor: Zheng-Heng Sun, Tu-Cheng (TW)

(73) Assignee: Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 129 days.

(21) Appl. No.: 11/309,729

(22) Filed: Sep. 15, 2006

(65) Prior Publication Data
US 2007/0284079 A1    Dec. 13, 2007

(30) Foreign Application Priority Data
May 24, 2006    (CN)    .................... 2006 1 0060738

(51) Int. Cl.
F28F 27/00    (2006.01)
F28F 7/00    (2006.01)
F01P 7/10    (2006.01)
H05K 7/20    (2006.01)
H01L 23/34    (2006.01)

(52) U.S. Cl. .............................. 165/98; 165/96; 165/99; 165/80.3; 165/185; 257/E23.09; 257/722; 361/704

(58) Field of Classification Search .................. 165/98, 165/185, 99, 80.3, 96; 257/E23.09, 722; 361/704
See application file for complete search history.

(56) References Cited

U.S. PATENT DOCUMENTS

| 1,459,593 | A | * | 6/1923 | Linde | 165/98 |
| 2,034,587 | A | * | 3/1936 | Maxwell | 454/155 |
| 4,432,514 | A | * | 2/1984 | Brandon | 244/118.5 |
| 4,523,657 | A | * | 6/1985 | Kooyumjian | 180/68.1 |
| 4,635,881 | A | * | 1/1987 | Brieseck et al. | 244/49 |
| 6,698,500 | B2 | * | 3/2004 | Noda et al. | 165/80.3 |
| 6,739,548 | B1 | * | 5/2004 | Bittle et al. | 244/3.29 |
| 2005/0274498 | A1 | | 12/2005 | Li et al. | |
| 2007/0019385 | A1 | * | 1/2007 | Chan | 361/704 |

* cited by examiner

Primary Examiner—Cheryl J Tyler
Assistant Examiner—Brandon M Rosati
(74) Attorney, Agent, or Firm—Wei Te Chung

(57) ABSTRACT

A heat dissipating device includes a heat sink, and an adjusting member. The heat sink includes a base, and a plurality of fins formed on a top surface of the base. The adjusting member includes a mounting portion mounted to a side surface facing an airflow-generating source of the base, a first air-blocking portion connected to an upper portion of the mounting part, and a second air-blocking portion connected to a lower portion of the mounting part. Positions of the first air-blocking portion and the second air-blocking portion relative to the base are adjustable for adjusting distribution of an airflow on top and bottom sides of the base when the airflow flows through the heat dissipating device.

7 Claims, 8 Drawing Sheets

US 7,581,583 B2

HEAT DISSIPATING DEVICE WITH ADJUSTING MEMBER

FIELD OF THE INVENTION

The invention relates to heat dissipating devices, and particularly to a heat dissipating device with an adjusting member for adjusting airflow entering into a heat sink thereof.

DESCRIPTION OF RELATED ART

During operation of a computer, electronic components, such as central processing units (CPUs), frequently generate large amounts of heat, therefore heat sinks are desired to dissipate heat from the electronic components.

Referring to FIG. 1, a conventional heat sink 10 comprises a base 12 and a plurality of spaced fins 14 formed on a top surface of the base 12. The heat sink 10 is attached to an electronic component 18 mounted on a motherboard 16, with a bottom surface of the base 12 thereof contacting a top surface of the electronic component 18. A fan (not shown) is set, to assist in heat dissipation, at one side of the heat sink 10 with a certain distance from the heat sink 10.

Referring to FIG. 2, airflow from the fan includes a first airflow 21 passing through the fins 14, a second airflow 22 passing between the base 12 and the motherboard 16, and a third airflow 23 passing a bottom of the motherboard 16.

The heat sink 10 can't adjust the distribution of the airflow entering into the heat sink 10 to maximize heat dissipation. For example, sometimes more first airflow 21 is needed to pass through the fins 14 when the electronic component 18 generates more heat. Sometimes more second airflow 22 is needed to pass between the base 12 and the motherboard 16, when the electronic component 18 generates little heat but another electronic component mounted on the motherboard 16 generates more heat.

What is needed is a heat dissipating device which is adjustable to adjust airflow entering into a heat sink.

SUMMARY OF THE INVENTION

An exemplary heat dissipating device including a heat sink, and an adjusting member is provided. The heat sink includes a base, and a plurality of fins formed on a top surface of the base. The adjusting member includes a mounting portion mounted to a side surface facing an airflow source of the base, a first air-blocking portion connected to an upper portion of the mounting part, and a second air-blocking portion connected to a lower portion of the mounting part. Positions of the first air-blocking portion and the second air-blocking portion relative to the base are adjustable for adjusting distribution of an airflow on top and bottom sides of the base when the airflow flows through the heat dissipating device.

Other advantages and novel features will become more apparent from the following detailed description when taken in conjunction with the accompanying drawing, in which:

DETAILED DESCRIPTION OF THE INVENTION

Figure 1:
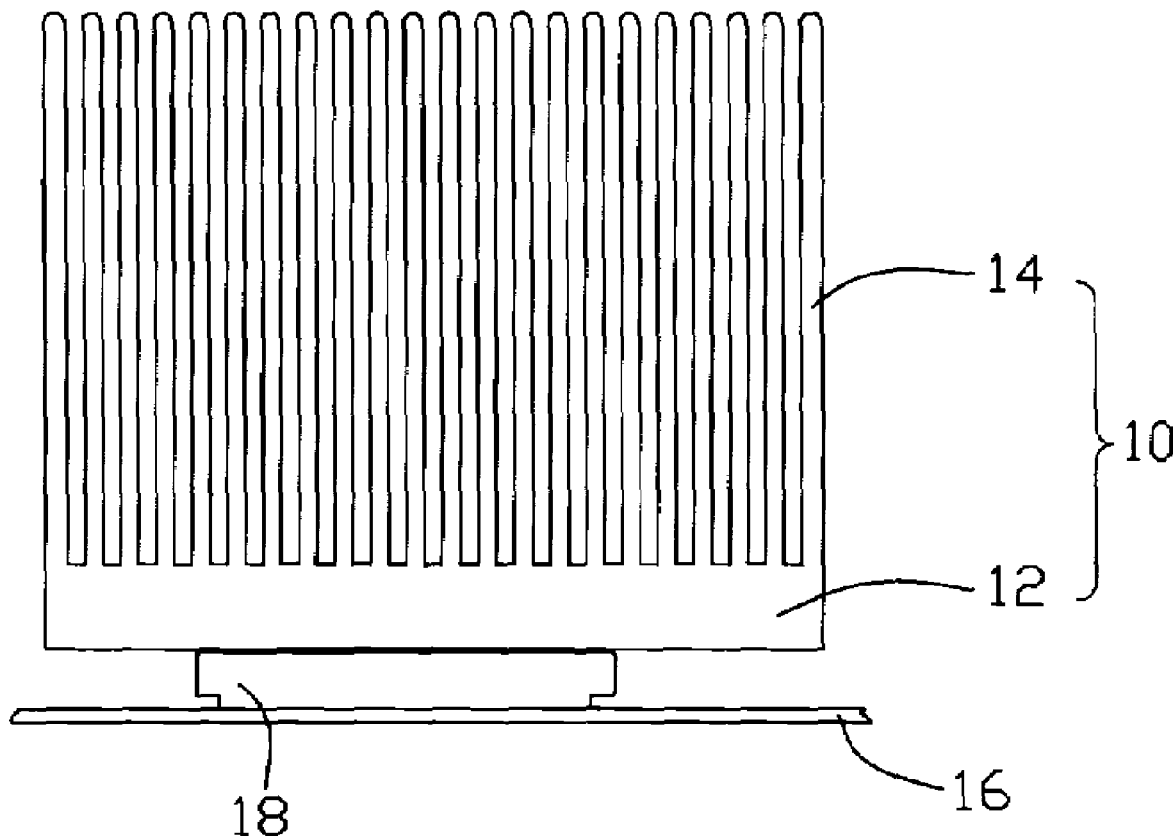
FIG. 1 is a front view of a conventional heat sink, with a motherboard and an electronic component on the motherboard.
Figure 2:
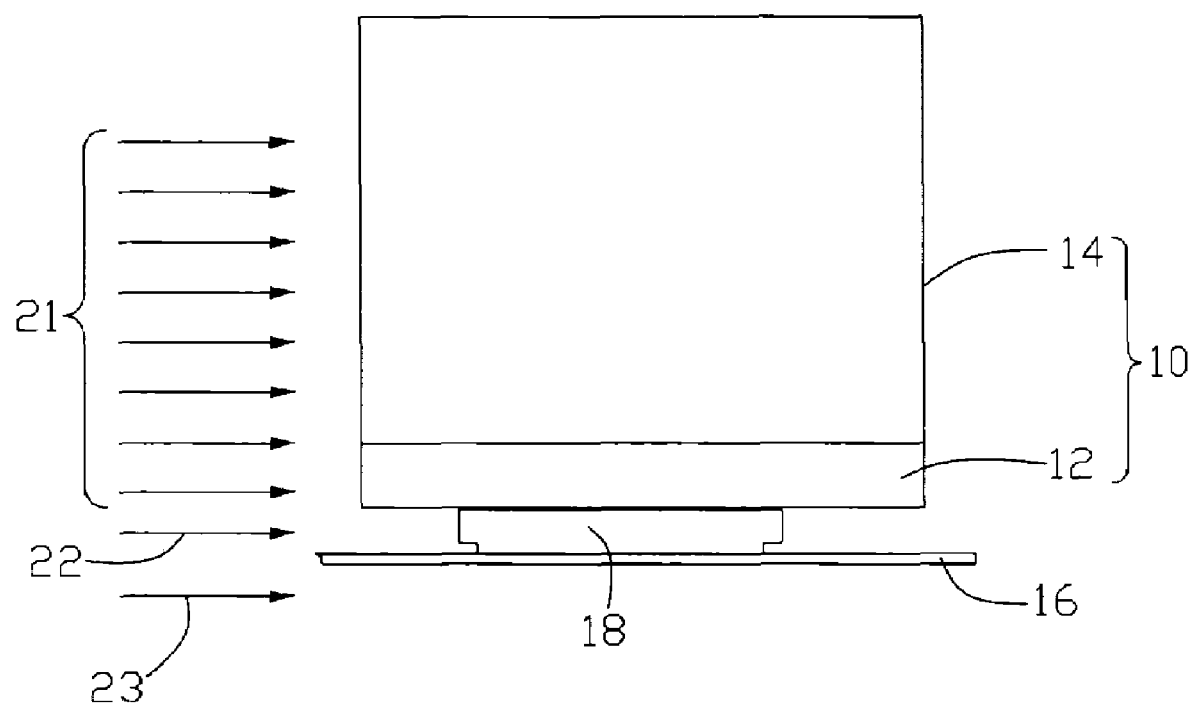
FIG. 2 is a right side view of FIG. 1.
Figure 3:
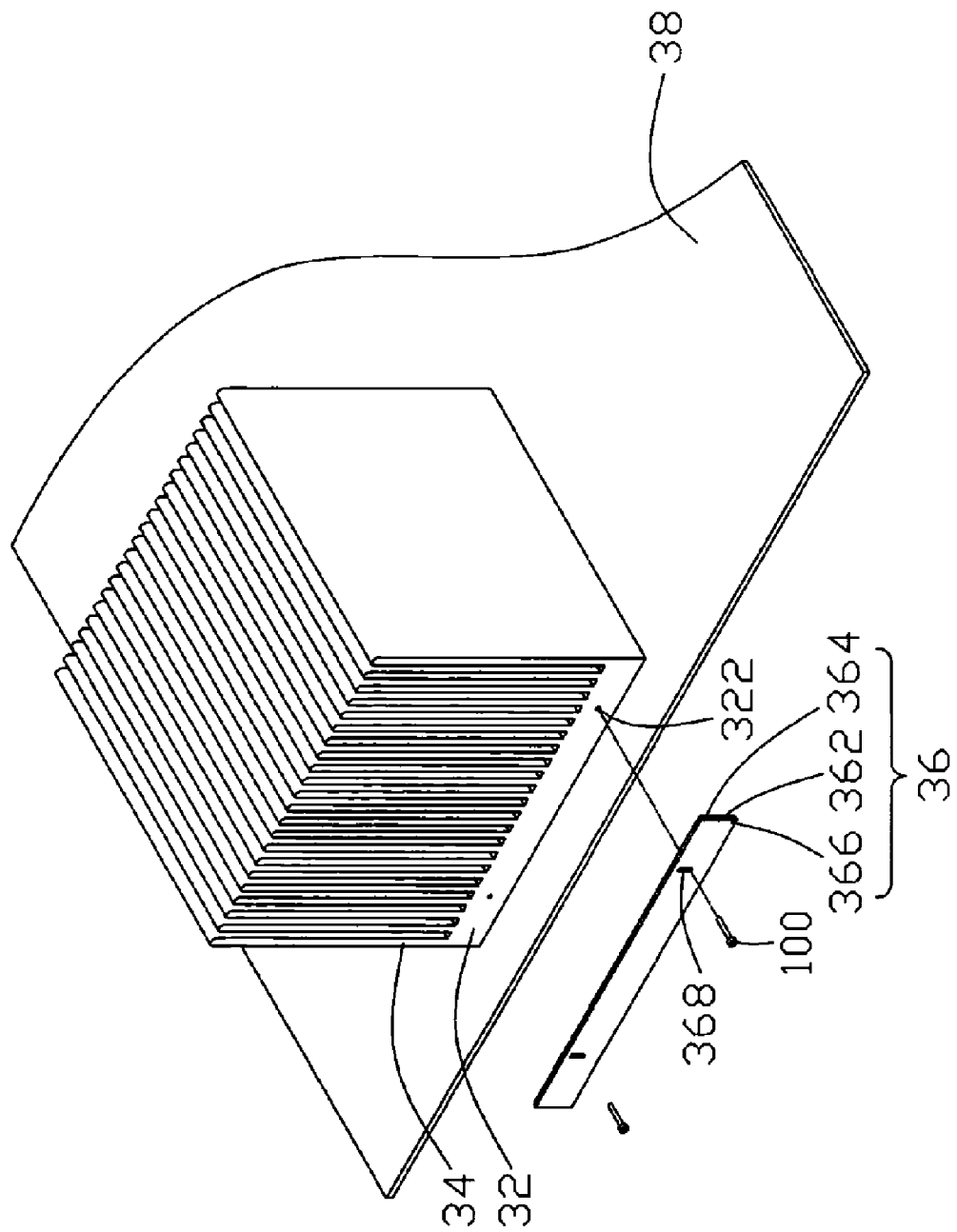
FIG. 3 is an exploded, isometric view of a heat dissipating device in accordance with a first preferred embodiment of the present invention, together with a motherboard, the heat dissipating device includes an adjusting member.

Referring to FIG. 3, a heat dissipating device in accordance with a first preferred embodiment of the present invention includes a heat sink, and an adjusting member 36.

The heat sink includes a base 32, and a plurality of spaced fins 34 formed on a top surface of the base 32.

The adjusting member 36 is a narrow generally rectangular shaped plate. The adjusting member 36 includes a mounting portion 362 at a middle portion thereof, a first air-blocking portion 364 at an upper portion thereof, and a second air-blocking portion 366 at a lower portion thereof. The adjusting member 36 is mounted to a side surface facing an airflow-generating source such as a fan (not shown) of the base 32. In this embodiment, a length of the adjusting member 36 equals that of the side surface of the base 32. A width of the adjusting member 36 is set according to practical requirements.

Two locking holes 322 are defined in the side surface of the base 32. Two sliding holes 368 are vertically defined in the mounting portion 362 of the adjusting member 36 corresponding to the locking holes 322 of the side surface of the base 32.

Figure 4:
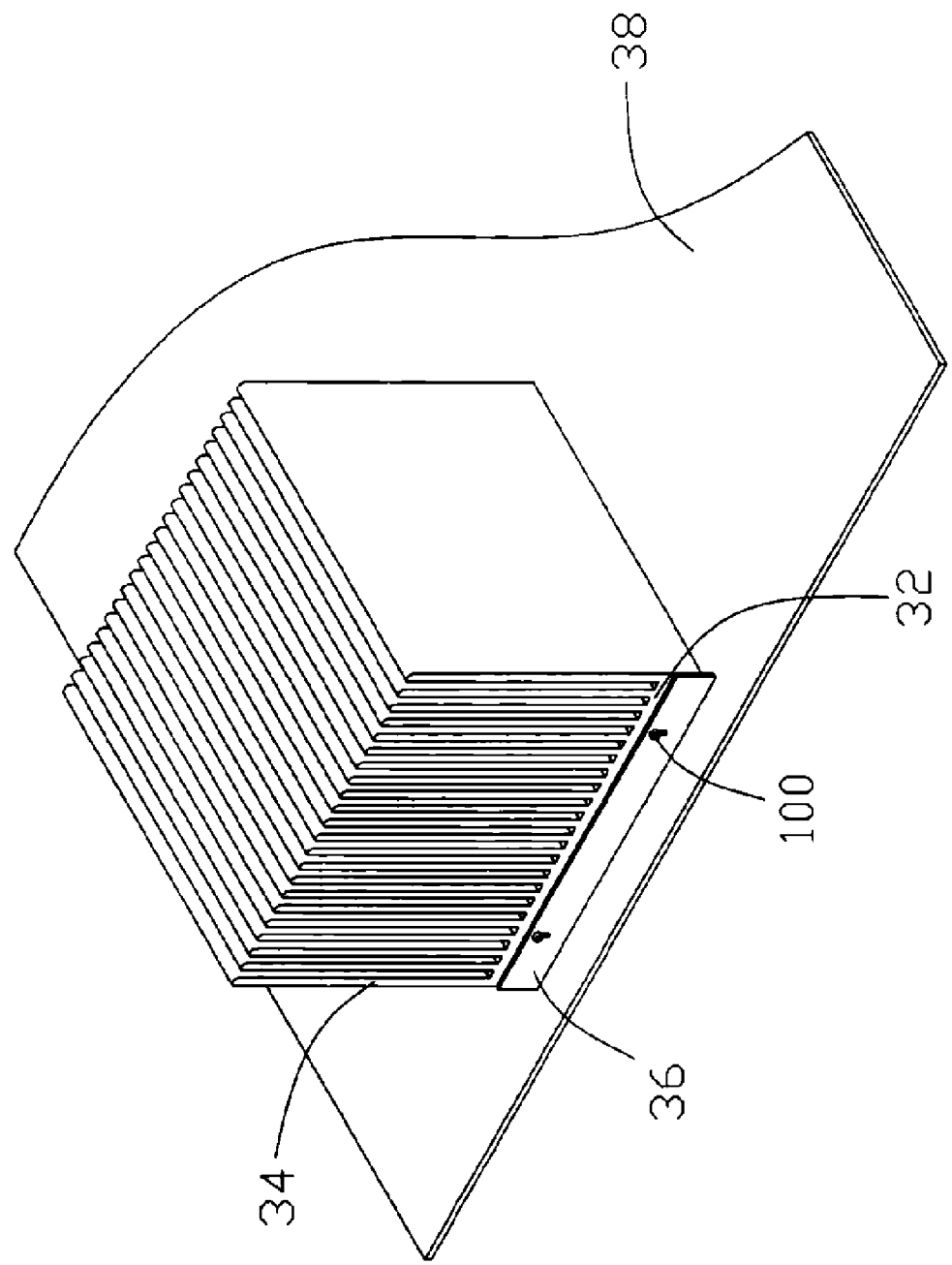
FIG. 4 is an assembled view of FIG. 3, showing the adjusting member in a first state.
Figure 5:
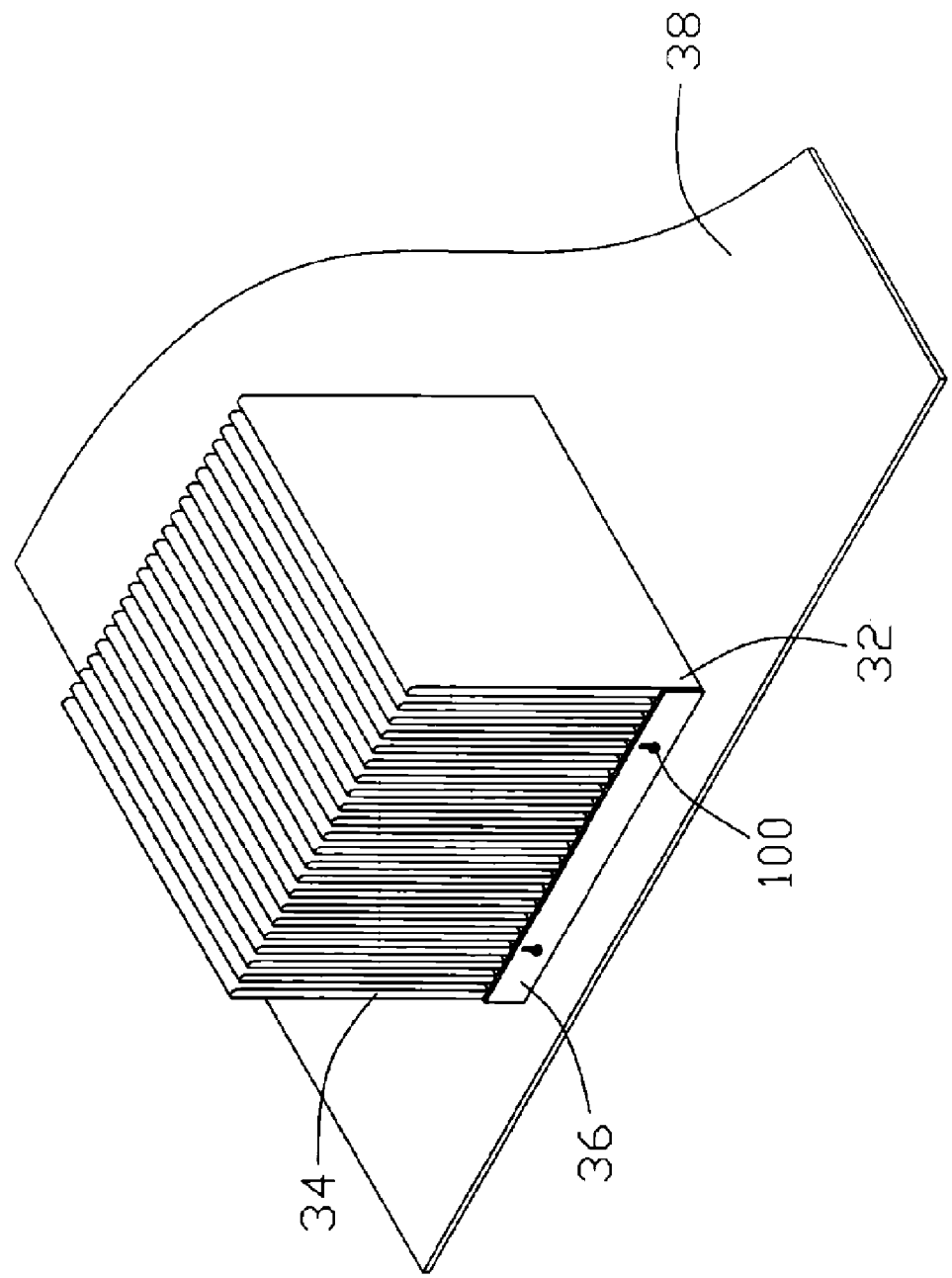
FIG. 5 is similar to FIG. 4, but showing the adjusting member in a second state.

Referring also to FIG. 4 and FIG. 5, in assembly, the adjusting member 36 is mounted to the base 32 by means, such as two screws 100, extending through the corresponding sliding holes 368 of the mounting portion 362 of the adjusting member 36, to engage in the corresponding locking holes 322 of the side surface of the base 32. The heat dissipating device is mounted on an electronic component (not shown) of a motherboard 38 for dissipating heat.

The fan is placed near and focused at the heat dissipating device for maximal heat dissipation. If an increase in airflow passing through the fins 34 is needed, the screws 100 are loosened and the adjusting member 36 is slid down, thus redirecting a portion of airflow to the base 32 to pass through the fins 34, and then retightened fixing the adjusting member 36 in place (FIG. 4). If it is desired to increase airflow to underside of the base 32 the adjusting member is raised rather than lowered, thus redirecting a portion of airflow to the fins 34 to underside of the base 32 (FIG. 5).

Figure 6:
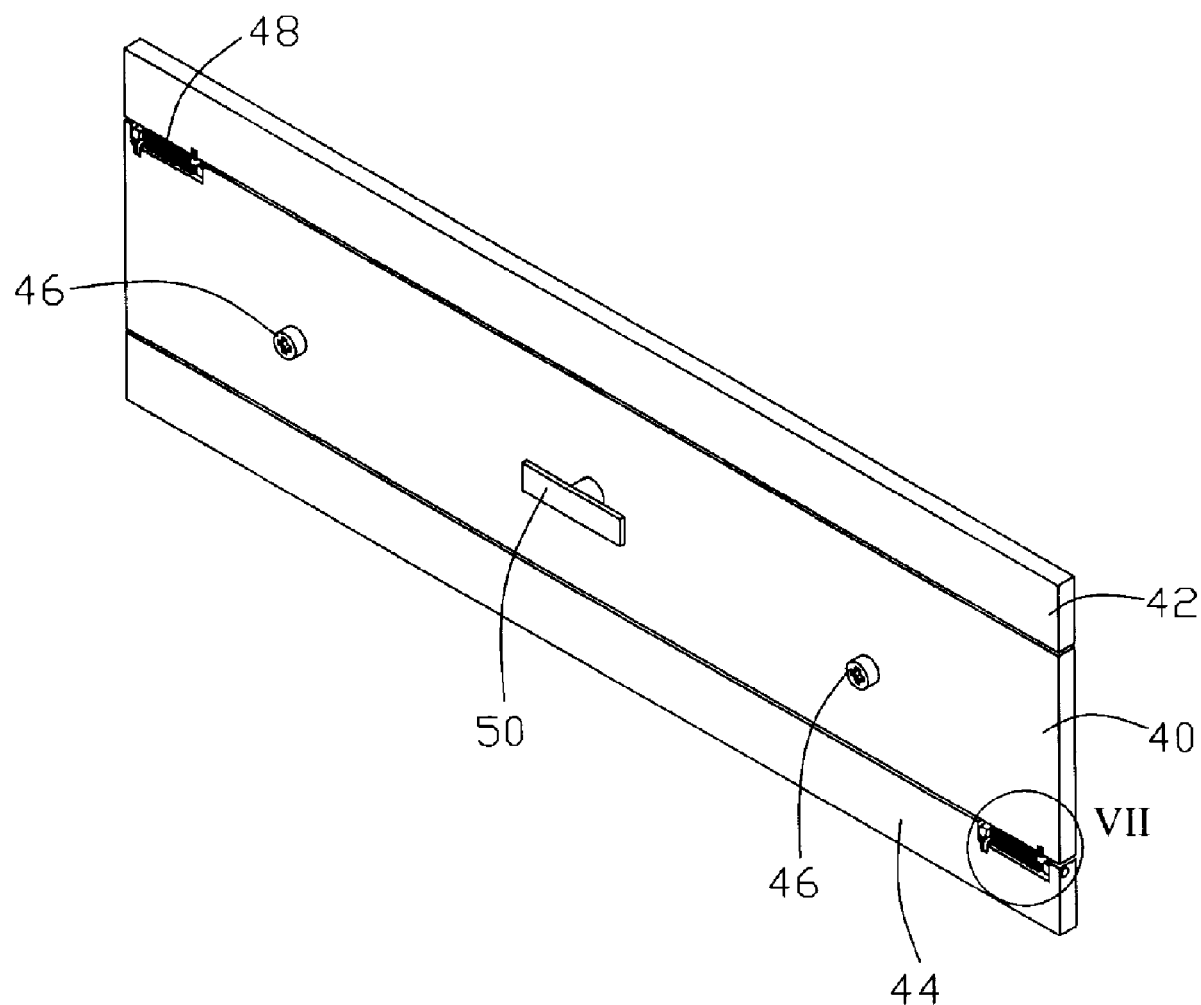
FIG. 6 is an isometric view of an adjusting member of a heat dissipating device in accordance with a second preferred embodiment of the present invention.
Figure 7:
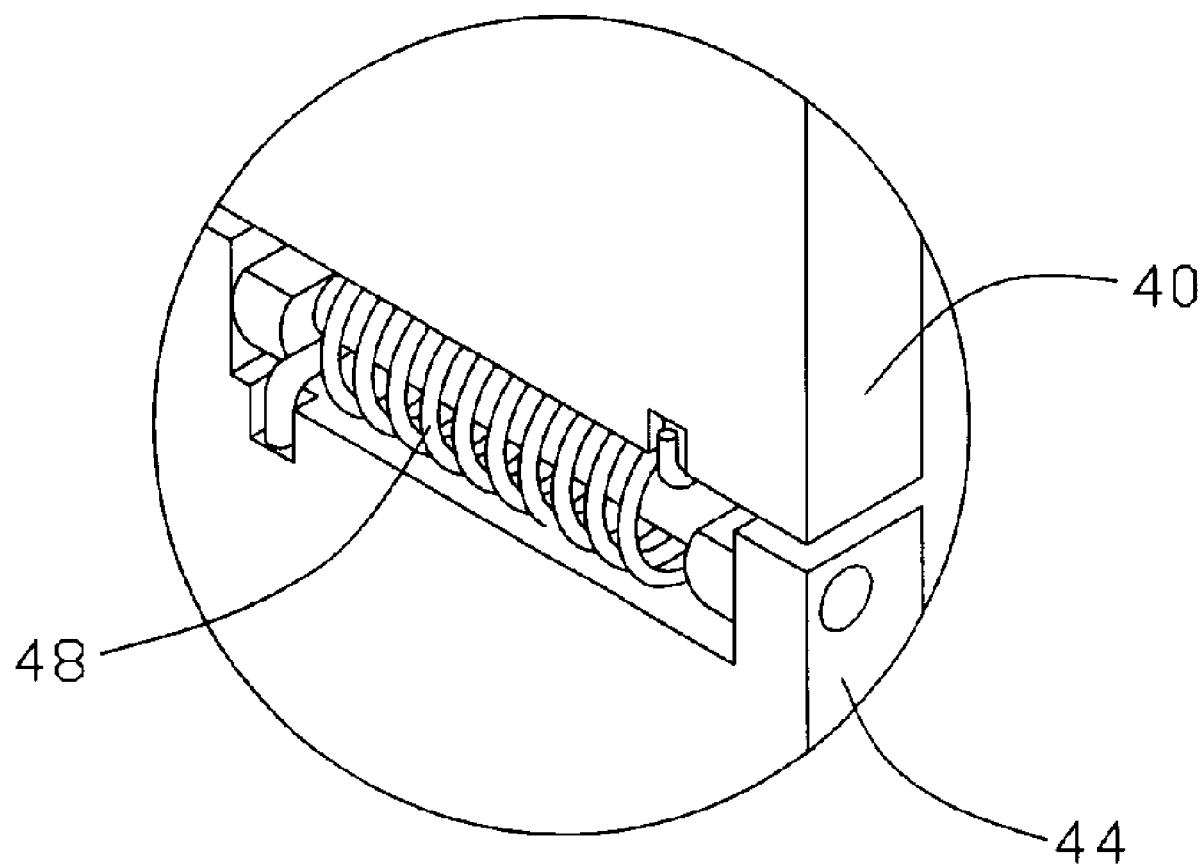
FIG. 7 is an enlarged view of a circled portion VII of FIG. 6.

Referring also to FIGS. 6 and 7, an adjusting member of a heat dissipating device in accordance with a second preferred embodiment of the present invention is shown. The adjusting member includes a mounting portion 40, a first air-blocking portion 42, and a second air-blocking portion 44.

The mounting portion 40 is mounted to the side surface facing the fan of the base 32 by means of two screws 46. In this embodiment, a length and a width of the mounting portion 40 are equal that of the side surface of the base 32. The first air-blocking portion 42 and the second air-blocking portion 44 are mounted on an upper portion and a lower portion of the mounting portion 40 respectively, each mounted by means of a torsion spring 48 and a hinge (not shown). A length of each of the first air-blocking portion 42 and the second air-blocking portion 44 equal that of the mounting portion 40.

A summation of widths of the first air-blocking portion 42 and the second air-blocking portion 44 is not more than the width of the mounting portion 40. A T-shaped locking member 50 is pivotally mounted to a middle of the mounting portion 40.

When no adjustment of airflow to the heat sink is required, the first air-blocking portion 42 and the second air-blocking portion 44 are folded over the mounting portion 40, and the T-shaped locking member 50 is rotated to a locking position to prevent the first air-blocking portion 42 and the second air-blocking portion 44 from elastically rebounding.

Figure 8:
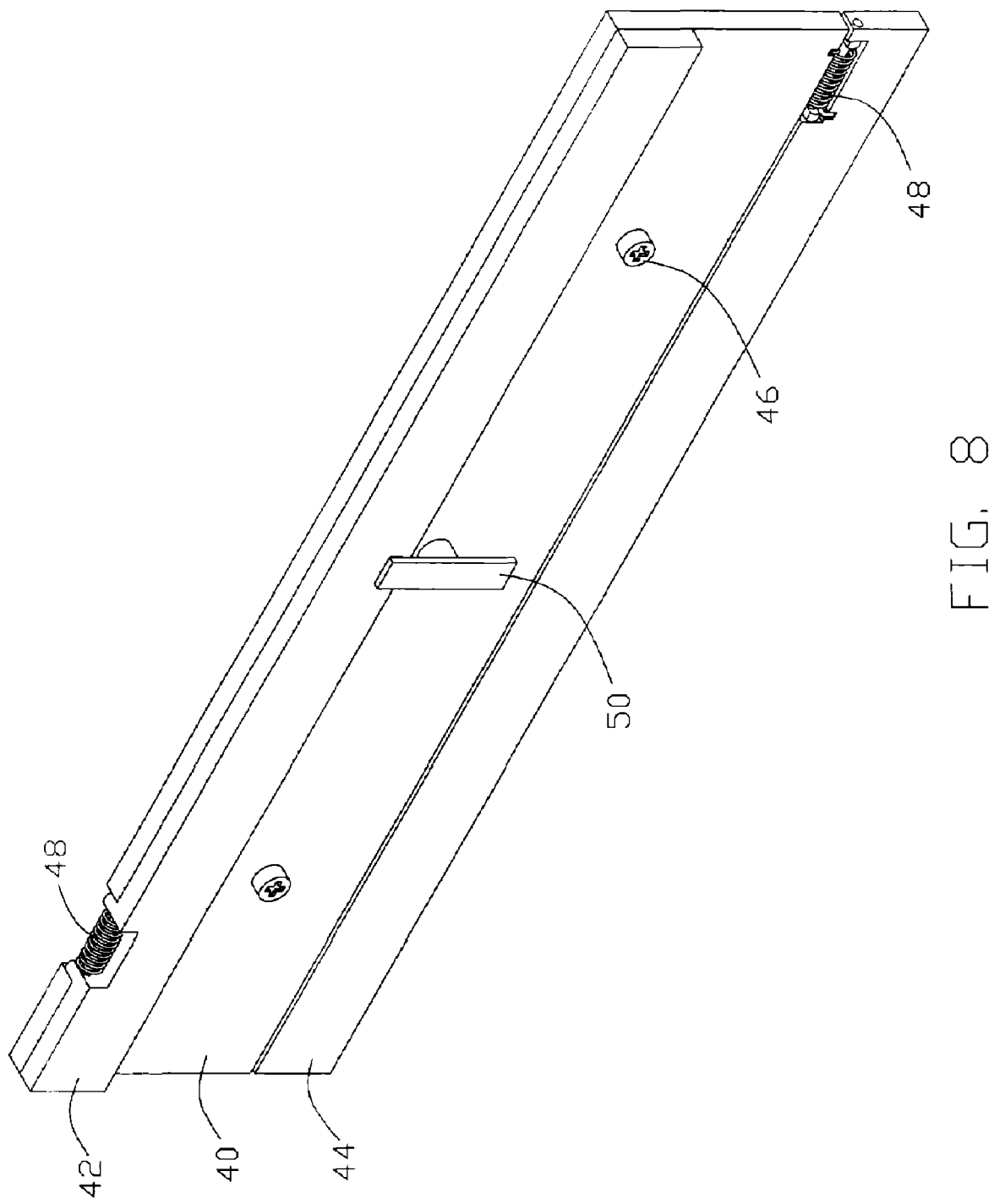
FIG. 8 is similar to FIG. 6, but showing the adjusting member with a top portion folded over.

Referring to FIG. 8, if airflow passing through the fins 34 is needed to be increased, the T-shaped locking member 50 is rotated allowing the second air-blocking portion 44 to rebound to an open position thus redirecting a portion of airflow to underside of the base 32 to pass through the fins 34. The first air-blocking portion 42 will also rebound but may be restrained by the user or returned to the folded position manually and the locking member rotated to again trap the first air-blocking portion 42. Similarly, to redirect airflow to the base 32 away from the fins 34 the above steps are used but releasing the first air-blocking portion 42 and restraining the second air-blocking portion 44.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A heat dissipating device comprising:
a heat sink comprising a base, and a plurality of fins formed on a top surface of the base, a passage being formed between the fins and having an inlet for entering of an airflow; and
an adjusting member comprising a mounting portion mounted to a side surface of the base near the inlet, a first air-blocking portion connected to an upper portion of the mounting portion, and a second air-blocking portion connected to a lower portion of the mounting portion, wherein the first air-blocking portion and the second air-blocking portion are capable of being rotated relative to the mounting portion, a position of the first air-blocking portion and a position of the second air-blocking portion relative to the base are adjustable for adjusting distribution of the airflow on top and bottom sides of the base;
wherein each of the first air-blocking portion and the second air-blocking portion is connected with the mounting portion with a torsion spring.

2. A heat dissipating device comprising:
a heat sink comprising a base, and a plurality of fins formed on a top surface of the base; and
an adjusting member comprising a mounting portion mounted to a side surface of the base, and an air-blocking portion rotatably mounted to the mounting portion, wherein the adjusting member is capable of controlling an airflow that enters into the fins by adjusting a position of the air-blocking portion relative to the base;
wherein the air-blocking portion is connected with the mounting portion with a torsion spring.

3. The heat dissipating device as claimed in claim 2, wherein the air-blocking portion is mounted on a top of the mounting portion, and the airflow entering into the fins can be decreased by adjusting the air-blocking portion until a portion of the air-blocking portion blocks a lower portion of the fins.

4. The heat dissipating device as claimed in claim 2, wherein the air-blocking portion is mounted on a bottom of the mounting portion, the airflow entering into the fins can be increased by adjusting the air-blocking portion until a portion of the air-blocking portion extends beyond a bottom of the base.

5. A heat dissipating device assembly comprising:
a circuit board with an electronic component mounted thereon;
a heat sink comprising a base contacting the electronic component, and a plurality of fins extending from the base away from the electronic component;
a first passage being formed between the fins;
a second passage being formed between the base and the circuit board; and
an adjusting member mounted to one lateral side of the base, the adjusting member comprising a mounting portion, and an air-blocking portion, wherein
the air-blocking portion is capable of being rotated relative to the mounting portion, the adjusting member is capable of selectively entering and blocking one portion of one of the first passage and the second passage for adjusting distribution of an airflow on the first and second passages;
wherein the air-blocking portion and the mounting portion are connected together with a torsion spring.

6. The heat dissipating device assembly as claimed in claim 5, wherein the fins are parallel to each other, the first passage comprising an inlet and an outlet, the adjusting member located adjacent the inlet.

7. The heat dissipating device assembly as claimed in claim 5, wherein the adjusting member further comprises a locking member which is capable of selectively restraining the air-blocking portion.

* * * * *